(12) United States Patent
Hung (10) Patent No.: US 11,378,099 B2
(45) Date of Patent: Jul. 5, 2022

(54) SHELL PLATE SOUND ISOLATING STRUCTURE

(71) Applicant: Silverstone Technology Co., Ltd., New Taipei (TW)

(72) Inventor: Wei-Cheng Hung, New Taipei (TW)

(73) Assignee: SILVERSTONE TECHNOLOGY CO., LTD., New Taipei (TW)

(*) Notice: Subject to any disclaimer, the term of this patent is extended or adjusted under 35 U.S.C. 154(b) by 317 days.

(21) Appl. No.: 16/872,780

(22) Filed: May 12, 2020

(65) Prior Publication Data

US 2021/0301834 A1   Sep. 30, 2021

(30) Foreign Application Priority Data

Mar. 31, 2020  (TW) .................. 109203723

(51) Int. Cl.
| | |
|---|---|
| *H05K 7/20* | (2006.01) |
| *G06F 1/20* | (2006.01) |
| *G10K 11/162* | (2006.01) |
| *F04D 29/66* | (2006.01) |

(52) U.S. Cl.
CPC .......... *F04D 29/664* (2013.01); *G10K 11/162* (2013.01); *H05K 7/20172* (2013.01); *G06F 1/20* (2013.01)

(58) Field of Classification Search
CPC ........................................................ G06F 1/20
See application file for complete search history.

(56) References Cited

U.S. PATENT DOCUMENTS

| | | | |
|---|---|---|---|
| 11,079,815 B2* | 8/2021 | Sato | G06F 1/20 |
| 2022/0151110 A9* | 5/2022 | Klein | H01L 35/28 |

* cited by examiner

*Primary Examiner* — Jerry Wu
(74) *Attorney, Agent, or Firm* — Chun-Ming Shih; HDLS IPR Services (57) ABSTRACT

A shell plate sound isolating structure is applied in a fan (100), and includes a hollow plate body (1) having a front plate (11), a rear plate (12) and an annular peripheral plate (13), wherein the rear plate (12) has a first wind port (14) where the fan (100) is disposed, the front plate (11) or the annular peripheral plate (13) has at least one second wind port (15); and at least one partition plate (2), disposed inside the hollow plate body (1) and capable of fully blocking between the first wind port (14) and the at least one second wind port (15), wherein a partition space (s) is formed between the at least one partition plate (2) and the hollow plate body (1) for forming an elongated flow channel (f) allowing the first wind port (14) and the second wind port (15) to be in communication.

12 Claims, 9 Drawing Sheets

FIG.9

SHELL PLATE SOUND ISOLATING STRUCTURE

BACKGROUND OF THE INVENTION

Field of the Invention

The present invention relates to a machine case structure, especially to a shell plate sound isolating structure.

Description of Related Art

Components, such as a power supplying device, a central process unit and a graphic display card, installed inside a computer mainframe would generate high heat during operations, for allowing the heat inside the computer mainframe to be rapidly dissipated, a front panel of the computer mainframe is formed with a ventilation hole in which a fan is disposed, and the fan is able to introduce an external airflow from the ventilation hole for guiding the airflow into the computer mainframe for a purpose of cooling.

However, under a situation of the disposed location of the ventilation hole and the installed location of the fan being close, an airflow generated by the fan is directly supplied to the ventilation hole when a flowing field of the airflow is not in a stable status, so that a bigger noise may generate while the airflow flowing through the ventilation hole. As such, how to design a front panel of a machine case capable of lowering noises generated by a fan is the main issue concerned by the applicant of the present invention.

Accordingly, the applicant of the present invention has devoted himself for improving the mentioned disadvantages.

SUMMARY OF THE INVENTION

The present invention is to provide a shell plate sound isolating structure, in which a first wind port and a second wind port are unable to be in direct communication with each other, the first wind port and the second wind port can only be in communication with each other via an elongated flow channel, so that an unstable flowing field of an airflow generated by a fan is only formed in the first wind port and the second wind port is protected from being directly affected, thereby enabling the shell plate sound isolating structure to be provided with an effect of reducing noises generated by the fan.

Accordingly, the present invention provides a shell plate sound isolating structure, applied in a fan and includes: a the hollow plate body, having a front plate, a rear plate and an annular peripheral plate annularly arranged at outer peripheries of the front plate and the rear plate, wherein the rear plate has a first wind port, the front plate or the annular peripheral plate has at least one second wind port, and the fan is disposed at the first wind port; and at least one partition plate, disposed inside the hollow plate body and arranged with a means of fully blocking between the first wind port and the at least one second wind port, wherein a partition space is formed between the at least one partition plate and the hollow plate body so as to form an elongated flow channel, so that the first wind port and the second wind port are only able to be in communication with each other via the elongated flow channel.

Based on what has been disclosed above, when the fan is disposed at the first wind port for purposes of exhausting air or blowing air, because the first wind port and the second wind port are blocked by the plurality of the partition plate and unable in direct communication with each other, an unstable flowing field of an airflow generated by the fan is only formed in the first wind port and the second wind port is protected from being directly affected, then the first wind port and the second wind port are in communication with each other via the elongated flow channel, so that the airflow with the unstable flowing field can be buffered by the elongated flow channel for forming an airflow with a stable flowing field, and the airflow is able to stably flow through the elongated flow channel and the second wind port, thereby enabling the shell plate sound isolating structure to be provided with an effect of reducing noises generated by the fan.

Based on what has been disclosed above, a surface of the partition plate and the front plate, and the rear plate and an inner wall surface of the annular peripheral plate are adhered with sound isolation materials, when the airflow flows through the partition plate or the hollow plate body, the sound isolating material is able to intercept sound transmissions, thereby further enhancing a noise reducing efficiency of the shell plate sound insolating structure.

DETAILED DESCRIPTION OF THE INVENTION

Preferred embodiments of the present invention will be described with reference to the drawings.

Please refer from FIG. 1 to FIG. 4. The present invention provides a shell plate sound isolating structure, which is applied in a fan 100, and mainly includes a hollow plate body 1 and one or a plurality of partition plates 2.

As shown from FIG. 1 to FIG. 4, the hollow plate body 1 has a front plate 11, a rear plate 12 and an annular peripheral plate 13 annularly arranged at outer peripheries of the front plate 11 and the rear plate 12. The rear plate 12 has a first wind port 14, the front plate 11 or the annular peripheral plate 13 has one or a plurality of second wind ports 15, and the fan 100 is disposed at the first wind port 14.

Details are provided as follows. The annular peripheral plate 13 has a top side plate 131, a bottom side plate 132, a left side plate 133 and a right side plate 134. The top side plate 131 is oppositely arranged with the bottom side plate 132, and the left side plate 133 is oppositely arranged with the right side plate 134.

According to this embodiment, there are two second wind ports 15, and the two second wind ports 15 are disposed on the left side plate 133 and the right side plate 134, respectively. Wherein, disposed locations of the second wind ports 15 can be altered according to actual needs and the arrangement of the second wind ports 15 disclosed in this embodiment of the present invention shall not be a limitation to the scope of the present invention.

Figure 1:
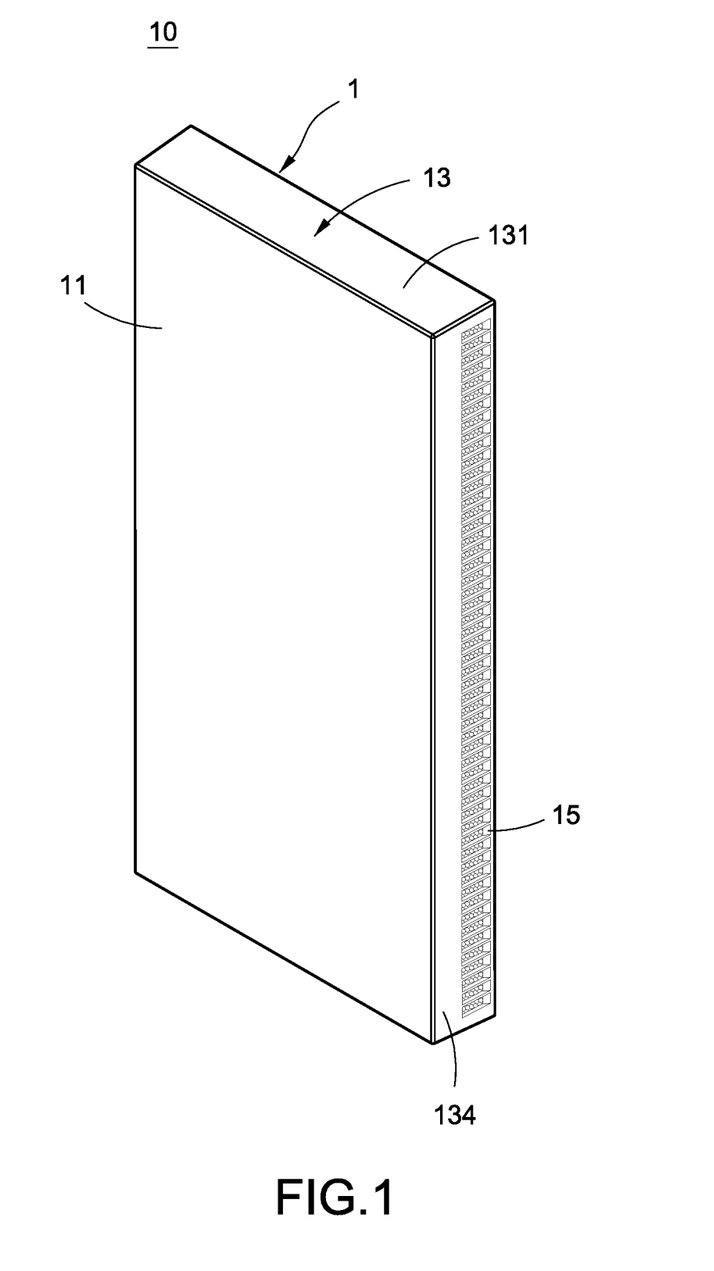
FIG. 1 is a perspective view showing an assembly of a shell plate sound isolating structure according to the present invention.
Figure 2:
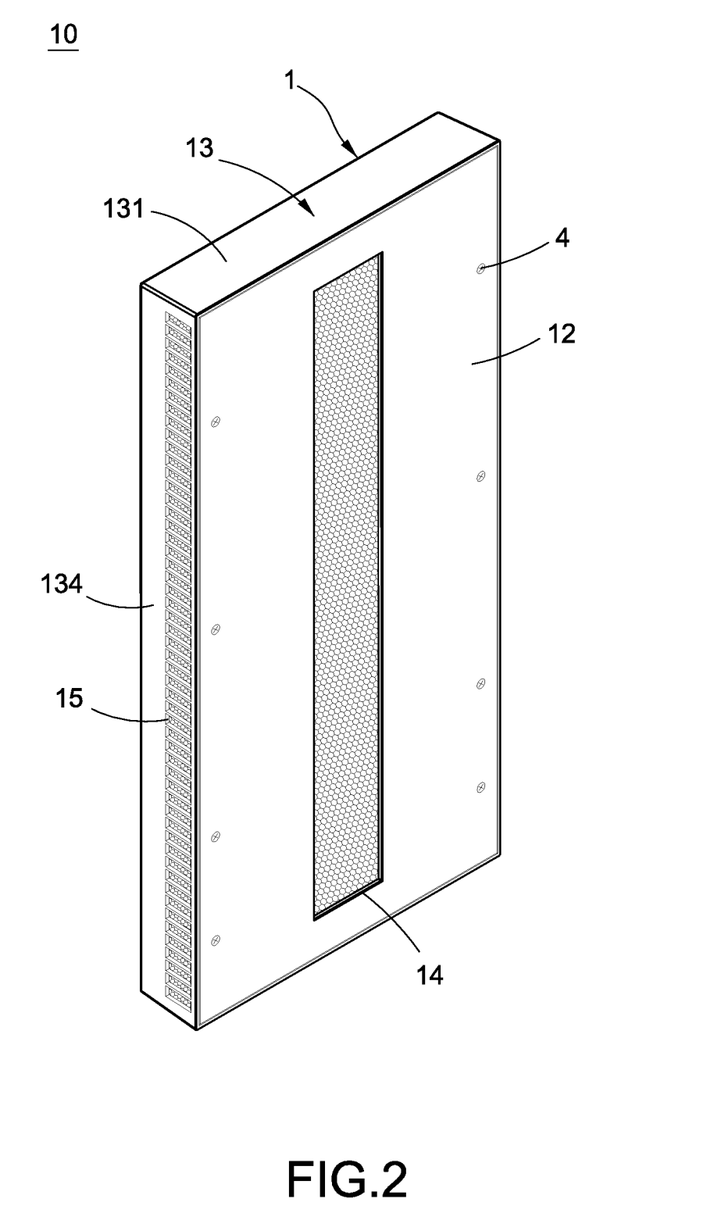
FIG. 2 is another perspective view showing the assembly of the shell plate sound isolating structure according to the present invention.
Figure 3:
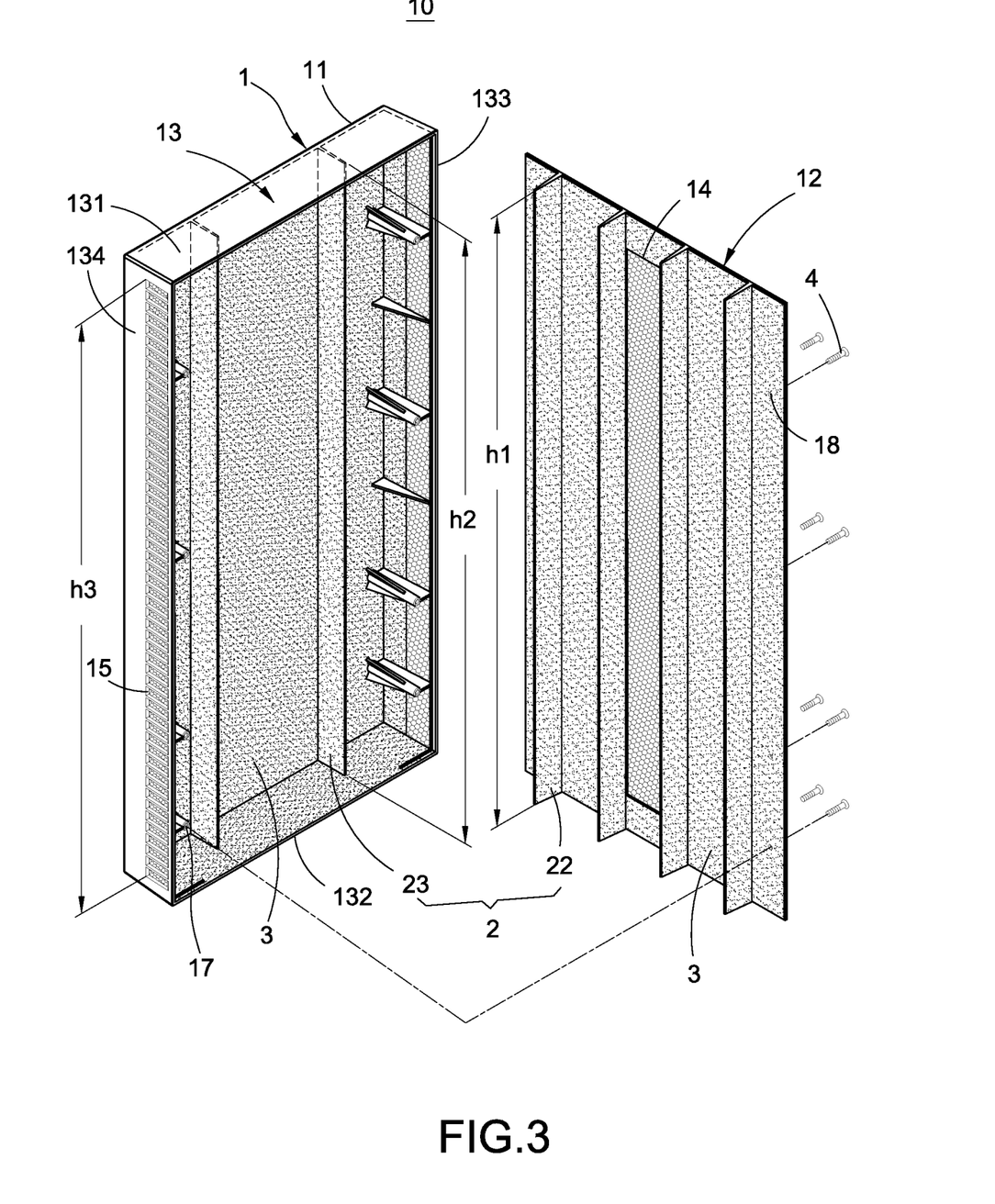
FIG. 3 is a perspective exploded view showing the shell plate sound isolating structure according to the present invention.
Figure 4:
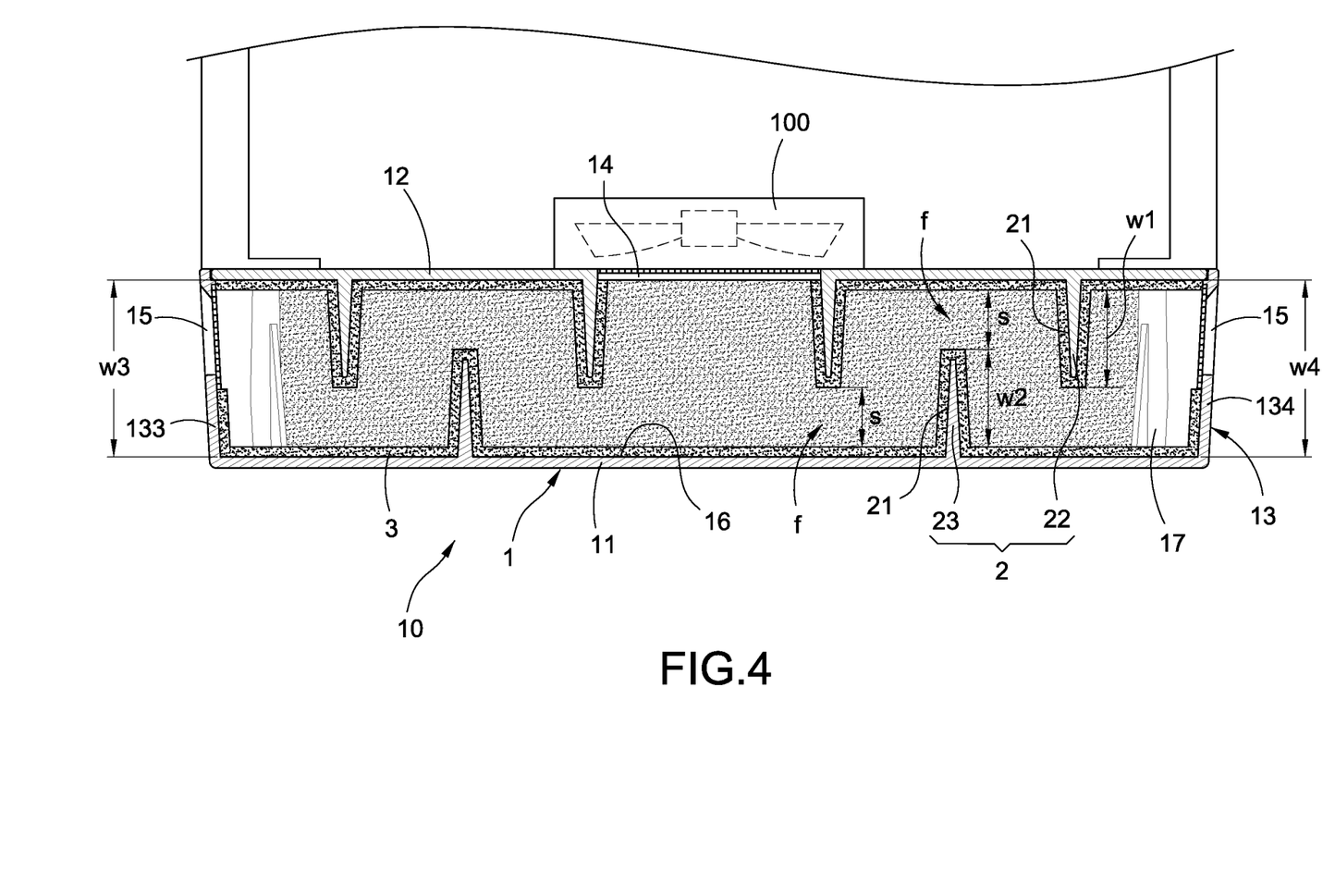
FIG. 4 is a cross sectional view showing the shell plate sound isolating structure according to the present invention.

As shown in FIG. 3 and FIG. 4, the partition plate 2 is disposed inside the hollow plate body 1 and arranged with a means of fully blocking between the first wind port 14 and the second wind port 15, in other words while being inwardly viewed from the first wind port 14, only the partition plate 2 can be seen and the second wind port 15 cannot be seen, while being inwardly viewed from the second wind port 15, only the partition plate 2 can be seen and the first wind port 14 cannot be seen, so that openings of the first wind port 14 and the second wind port 15 are fully blocked by the partition plate 2 and unable to be in direct communication with each other.

Moreover, the first wind port 14 and the second wind port 15 are partitioned by the partition plate 2 and unable to be in direct communication with each other, but a partition space s is formed between the partition plate 2 and the hollow plate body 1 so as to form an elongated flow channel f, so that the first wind port 14 and the second wind port 15 can only be in communication with each other via the elongated flow channel f.

Details are provided as follows. For allowing the two second wind ports 15 to be respectively formed on the left side plate 133 and the right side plate 134, the quantity of the partition plate 2 is an even number according to this embodiment, the plural partition plates 2 are divided into a plurality of first partition plates 22 and a plurality of second partition plates 23, each of the first partition plates 22 is extended from the rear plate 12 and a partition space s is formed between the front plate 11 and each of the first partition plates 22; each of the second partition plates 23 is extended from the front plate 11 and a partition space s is formed between the rear plate 12 and each of the second partition plates 23; and each of the first partition plates 22 and each of the second partition plates 23 are disposed in parallel between the left side plate 133 and the right side plate 134 and staggeringly arranged with each other.

According to this embodiment, a height h1 of each of the first partition plate 22 and a height h2 of each of the second partition plates 23 are greater than a height h3 of each of the second wind ports 15, a sum of a width w1 of each of the first partition plates 22 and a width w2 of each of the second partition plates 23 is greater than a width w3 of the left side plate 133 and a width w4 of the right side plate 134, so that the plural first partition plates 22 and the plural second partition plates 23 can be ensured to fully block between the first wind port 14 and the second wind port 15.

As shown in FIG. 3 and FIG. 4, the shell plate sound isolating structure 10 provided by the present invention further includes a plurality of sound isolating materials 3, the sound isolating materials 3 are adhered on a surface 21 of the partition plate 2 and the front plate 11, the rear plate 12 and an inner wall surface 16 of the annular peripheral plate 13, and the sound isolating materials 3 can be used for intercepting sound transmissions.

As shown in FIG. 3 and FIG. 4, the shell plate sound isolating structure 10 provided by the present invention further includes a plurality of screws 4, the annular peripheral plate 13 is formed through being extended from an outer circumference of the front plate 11, a plurality of screw hole columns 17 are extended from the front plate 11, a plurality of lock holes 18 are formed on the rear plate 12, each of the screws 4 is screwed in each of the lock holes 18 and each of the screw hole columns 17 respectively, so that the hollow plate body 1 can be formed through assembling the front plate 11, the rear plate 12 and the annular peripheral plate 13, but what shall be addressed is that the scope of the present invention is not limited to the disclosed assembling means of the hollow plate body 1, other assembling means can also be adopted according to actual needs.

FIG. 4 shows an operating status of the shell plate sound isolating structure 10 according to the present invention; when the fan 100 is disposed at the first wind port 14 for purposes of exhausting air or blowing air, because the first wind port 14 and the second wind port 15 are blocked by the plurality of the partition plates 2 and unable in direct communication with each other, an unstable flowing field of an airflow generated by the fan 100 is only formed in the first wind port 14 and the second wind port 15 is protected from being directly affected, then the first wind port 14 and the second wind port 15 are in communication with each other via the elongated flow channel f, so that the airflow with the unstable flowing field can be buffered by the elongated flow channel f for forming an airflow with a stable flowing field, and the airflow is able to stably flow through the elongated flow channel f and the second wind port 15, thereby enabling the shell plate sound isolating structure 10 of the present invention to be provided with an effect of reducing noises generated by the fan 100. Wherein, the fan 100 can be an air exhausting air or an air blowing fan, but a better noise reducing effect can be provided when the fan 100 is the air exhausting fan.

Moreover, the surface 21 of the partition plate 2 and the front plate 11, and the rear plate 12 and the inner wall surface 16 of the annular peripheral plate 13 are adhered with the sound isolation materials 3, when the airflow flows through the partition plate 2 or the hollow plate body 1, the sound isolating material 3 is able to intercept sound transmissions, thereby further enhancing a noise reducing efficiency of the shell plate sound insolating structure 10.

As shown in FIG. 4, the shell plate sound isolating structure 10 provided by the present invention is to be installed on a front panel of a computer frame, but the scope of the present invention is not limited to the disclosed arrangement, the shell plate sound isolating structure 10 of the present invention can be applied in any type of machine case where a fan is disposed and a noise reducing effect is required.

Figure 5:
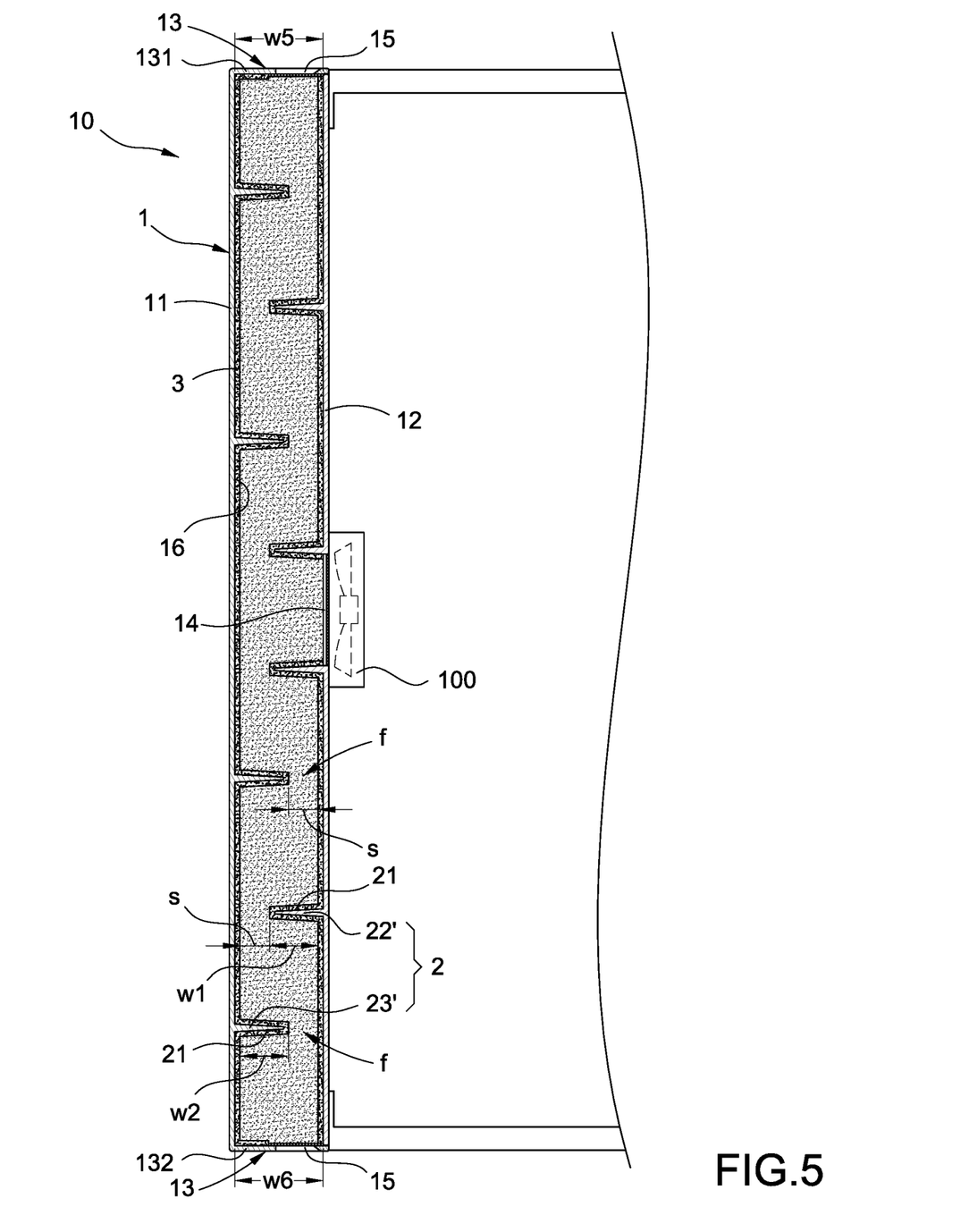
FIG. 5 is a cross sectional view showing the shell plate sound isolating structure according to another embodiment of the present invention.
Figure 6:
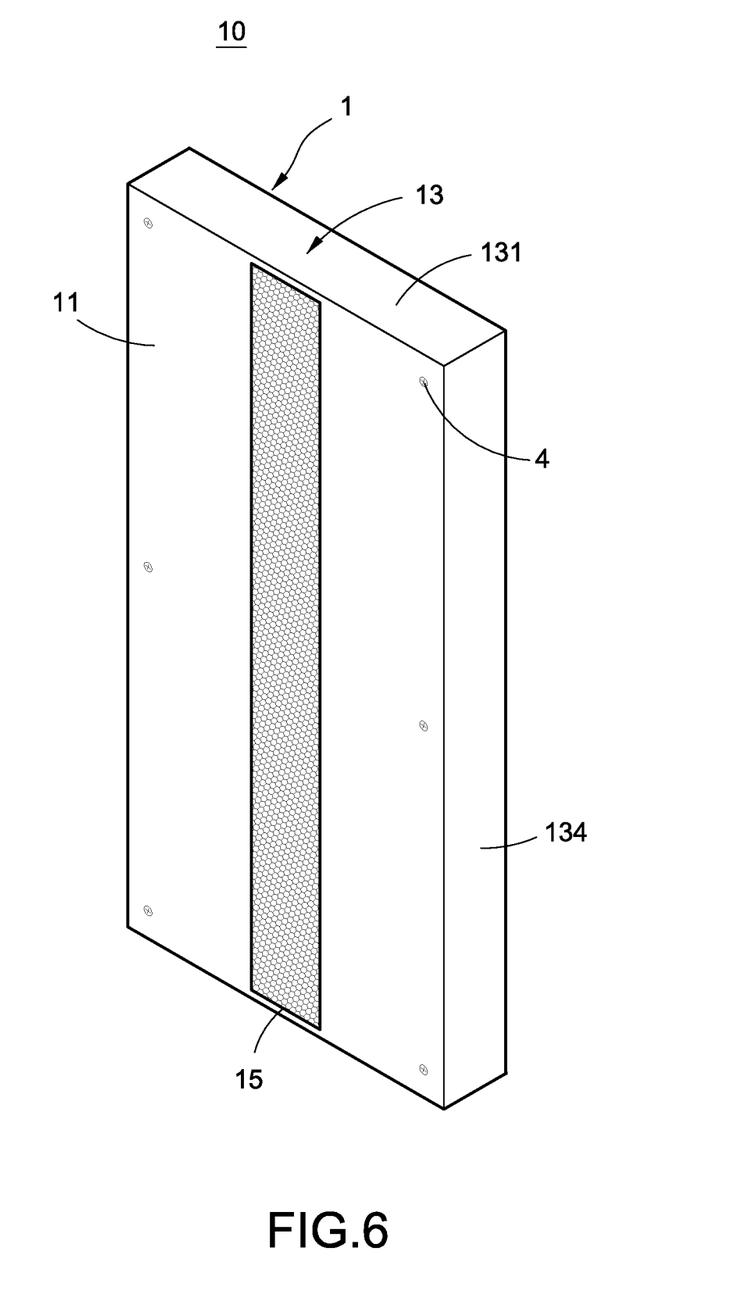
FIG. 6 is a perspective view showing the assembly of the shell plate sound isolating structure according to still another embodiment of the present invention.
Figure 7:
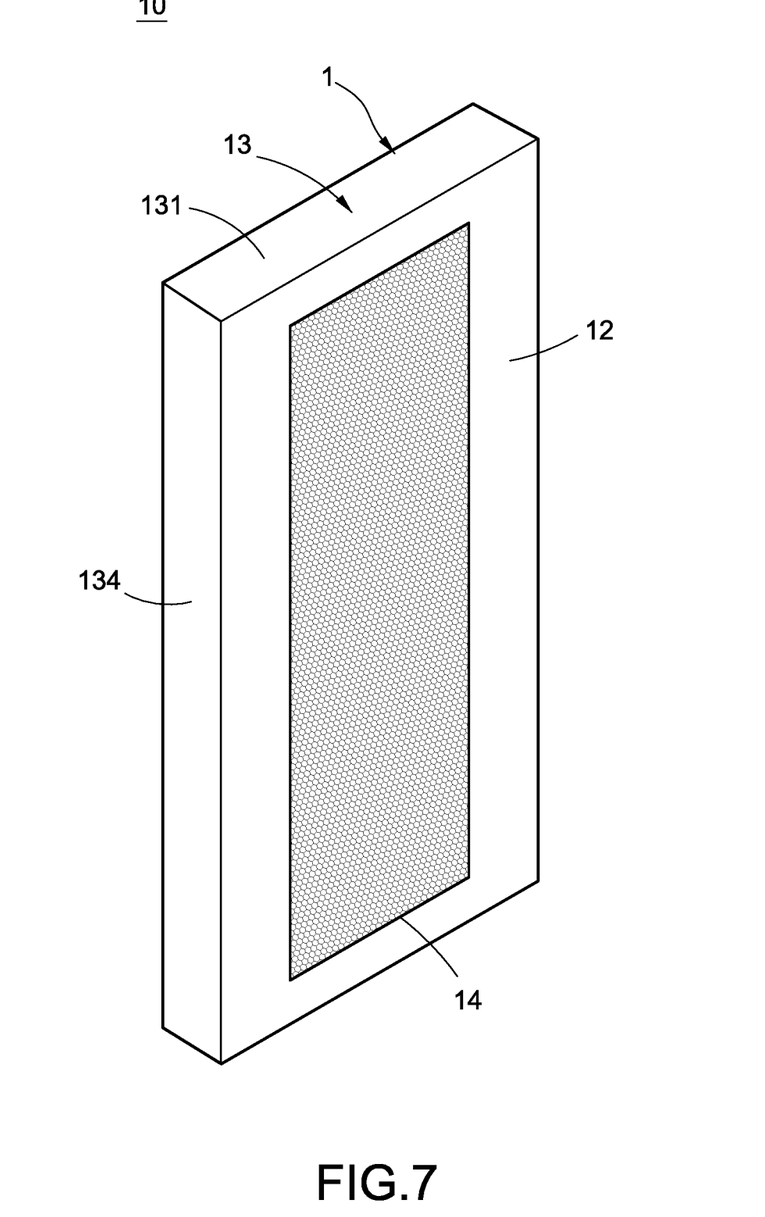
FIG. 7 is another perspective view showing the assembly of the shell plate sound isolating structure according to the still another embodiment of the present invention.
Figure 8:
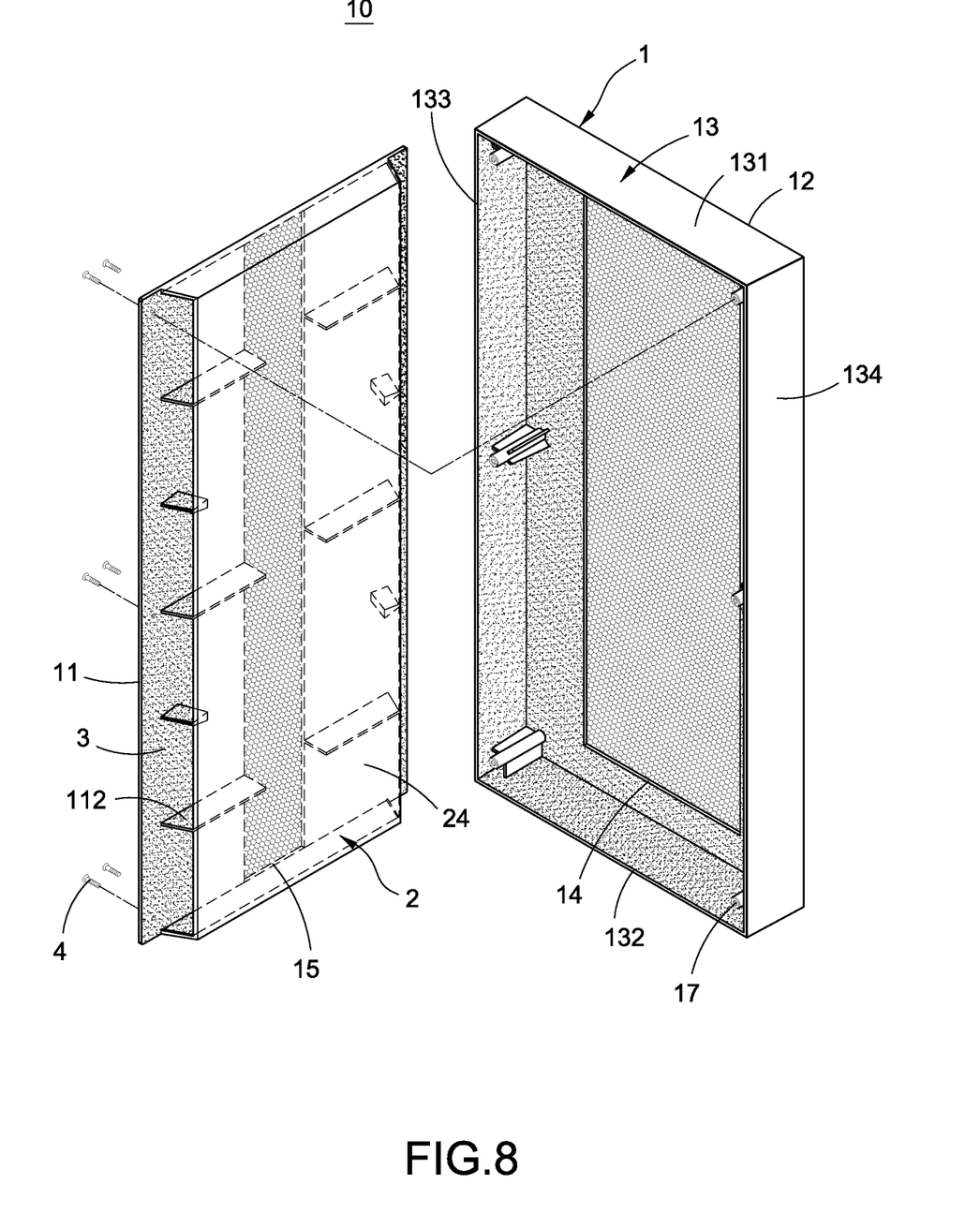
FIG. 8 is a perspective exploded view showing the shell plate sound isolating structure according to the still another embodiment of the present invention.
Figure 9:
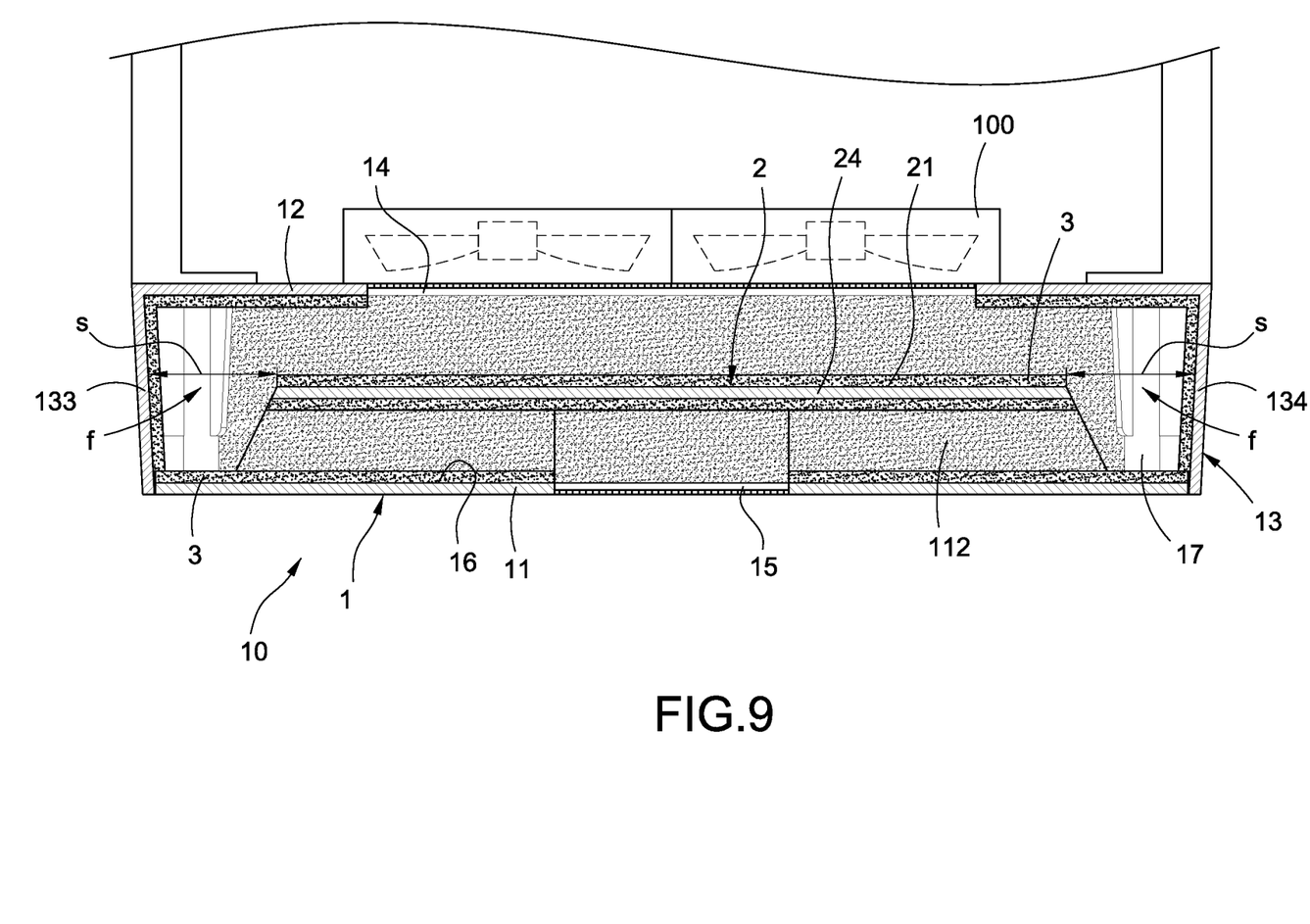
FIG. 9 is a cross sectional view showing the shell plate sound isolating structure according to the still another embodiment of the present invention.

Please refer to FIG. 5, which discloses another embodiment of the shell plate sound isolating structure 10 provided by the present invention, the embodiment disclosed in FIG. 5 is substantially the same of the embodiment disclosed from FIG. 1 to FIG. 4, a difference between the embodiment disclosed in FIG. 5 and the embodiment disclosed from FIG. 1 to FIG. 4 is that the second wind port 15 is disposed at a different location.

Details are provided as follows. According to this embodiment, there are two second wind ports 15, and the two second wind ports 15 are disposed on the top side plate 131 and the bottom side plate 132 respectively.

For allowing the two second wind ports 15 to be respectively formed on the top side plate 131 and the bottom side plate 132, the quantity of the partition plate 2 is an even number according to this embodiment, the plural partition plates 2 are divided into a plurality of first partition plates 22' and a plurality of second partition plates 23', each of the first partition plates 22' is extended from the rear plate 12 and a partition space s is formed between the front plate 11 and each of the first partition plates 22'; each of the second partition plates 23' is extended from the front plate 11 and a partition space s is formed between the rear plate 12 and each of the second partition plates 23'; and each of the first partition plates 22' and each of the second partition plates 23' are disposed in parallel between the top side plate 131 and the bottom side plate 132 and staggeringly arranged with each other.

Moreover, according to this embodiment, a length of each of the first partition plate 22' and a length of each of the second partition plates 23' are greater than a length of each of the second wind ports 15, a sum of a width w1 of each of the first partition plates 22' and a width w2 of each of the second partition plates 23' is greater than a width w5 of the top side plate 131 and a width w6 of the bottom side plate 132, so that the plural first partition plates 22' and the plural second partition plates 23' can be ensured to fully block between the first wind port 14 and the second wind port 15, thus the same functions and effects provided by the embodiment disclosed from FIG. 1 to FIG. 4 can be achieved.

Please refer from FIG. 6 to FIG. 9, which disclose another embodiment of the shell plate sound isolating structure 10 provided by the present invention, the embodiment disclosed from FIG. 6 to FIG. 9 is substantially the same of the embodiment disclosed from FIG. 1 to FIG. 4, a difference between the embodiment disclosed from FIG. 6 to FIG. 9 and the embodiment disclosed from FIG. 1 to FIG. 4 is that the second wind port 15 is disposed at a different location.

Details are provided as follows. According to this embodiment, there is one second wind port 15, and the second wind port 15 is disposed on the front plate 11 and oppositely arranged with the first wind port 14.

Moreover, for allowing the second wind port 15 to be formed on the top plate 11, the quantity of the partition plate 2 is one according to this embodiment, the partition plate 2 is disposed between the front plate 11 and the rear plate 12, and a partition space s is formed between the partition plate 2, the left side plate 133 and the right side plate 134.

Moreover, an outer circumferential dimension of the partition plate 2 is greater than an inner circumferential dimension of the first wind port 14 and an inner circumferential dimension of the second wind port 15. Accordingly, the same functions and effects provided by the embodiment disclosed from FIG. 1 to FIG. 4 can be achieved.

Moreover, the partition plate 2 is a U-shaped shield plate 24 extended from the front plate 11 and crossingly disposed a top side and a bottom side of the second wind port 15, the front plate 11 has a plurality of fastening ribs 112 extended and abutted against the U-shaped shield plate 24 for reinforcing the structural strength of the U-shaped shield plate 24. What shall be addressed is that the scope of the present invention is not limited to the disclosed arrangement of the partition plate 2, other arrangements can be adopted according to actual needs.

According to this embodiment, the annular peripheral plate 13 is formed through being extended from an outer circumference of the rear plate 12, a plurality of screw hole columns 17 are extended from the rear plate 12, a plurality of lock holes 18 are formed on the front plate 11, each of the screws 4 is screwed in each of the lock holes 18 and each of the screw hole columns 17 respectively, so that the hollow plate body 1 can be formed through assembling the front plate 11, the rear plate 12 and the annular peripheral plate 13, but what shall be addressed is that the scope of the present invention is not limited to the disclosed assembling means of the hollow plate body 1, other assembling means can also be adopted according to actual needs.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A shell plate sound isolating structure, applied in a fan and the shell plate sound isolating structure including: a hollow plate body, having a front plate, a rear plate and an annular peripheral plate annularly arranged between outer peripheries of the front plate and the rear plate, wherein the rear plate has a first wind port, the front plate or the annular peripheral plate has at least one second wind port, and the fan is disposed at the first wind port; and at least one partition plate, disposed inside the hollow plate body and arranged with a means of fully blocking between the first wind port and the at least one second wind port, wherein a partition space is formed between the at least one partition plate and the hollow plate body so as to form an elongated flow channel, so that the first wind port and the second wind port are only able to be in communication with each other via the elongated flow channel; and a U-shaped shield plate extended from the front plate and crossingly disposed a top side and a bottom side of the second wind port, and the front plate has a plurality of fastening ribs extended and abutted against the U-shaped shield plate; and an outer circumferential dimension of the U-shaped shield plate is greater than an inner circumferential dimension of the first wind port and an inner circumferential dimension of the second wind port.

2. The shell plate sound isolating structure according to claim 1, further including a plurality of sound isolating materials (3), and the sound isolating materials (3) are adhered on a surface (21) of the at least one partition plate (2).

3. The shell plate sound isolating structure according to claim 2, wherein the sound isolating materials (3) are adhered on the front plate (11), the rear plate (12) and an inner wall surface (16) of the annular peripheral plate (13).

4. The shell plate sound isolating structure according to claim 1, wherein the annular peripheral plate (13) has a left side plate (133) and a right side plate (134) oppositely arranged, there are two second wind ports (15), and the two second wind ports (15) are disposed on the left side plate (133) and the right side plate (134).

5. The shell plate sound isolating structure according to claim 4, wherein there are a plurality of partition plates (2), the partition plates (2) are divided into a plurality of first partition plates (22) and a plurality of second partition plates (23), each of the first partition plates (22) is extended from the rear plate (12) and a partition space (s) is formed between the front plate (11) and each of the first partition plates (22); each of the second partition plates (23) is extended from the front plate (11) and a partition space (s) is formed between the rear plate (12) and each of the second partition plates (23); and each of the first partition plates (22) and each of the second partition plates (23) are disposed in parallel between the left side plate (133) and the right side plate (134) and staggeringly arranged with each other.

6. The shell plate sound isolating structure according to claim 5, wherein a height (h1) of each of the first partition plate (22) and a height (h2) of each of the second partition plates (23) are greater than a height (h3) of each of the second wind ports (15), a sum of a width (w1) of each of the first partition plates (22) and a width (w2) of each of the second partition plates (23) is greater than a width (w3) of the left side plate (133) and a width (w4) of the right side plate (134).

7. The shell plate sound isolating structure according to claim 1, wherein the annular peripheral plate (13) has a top side plate (131) and a bottom side plate (132) oppositely arranged, there are two second wind ports (15), and the two second wind ports (15) are disposed on the top side plate (131) and the bottom side plate (132).

8. The shell plate sound isolating structure according to claim 7, wherein there are a plurality of partition plates (2), the partition plates (2) are divided into a plurality of first partition plates (22') and a plurality of second partition plates (23'), each of the first partition plates (22') is extended from the rear plate (12) and a partition space (s) is formed between the front plate (11) and each of the first partition plates (22'); each of the second partition plates (23') is extended from the front plate (11) and a partition space (s) is formed between the rear plate (12) and each of the second partition plates (23'); and each of the first partition plates (22') and each of the second partition plates (23') are disposed in parallel between the top side plate (131) and the bottom side plate (132) and staggeringly arranged with each other.

9. The shell plate sound isolating structure according to claim 8, wherein a length of each of the first partition plate (22') and a length of each of the second partition plates (23') are greater than a length of each of the second wind ports (15), a sum of a width (w1) of each of the first partition plates (22') and a width (w2) of each of the second partition plates (23') is greater than a width (w5) of the top side plate (131) and a width (w6) of the bottom side plate (132).

10. The shell plate sound isolating structure according to claim 1, wherein there is one second wind port (15), and the second wind port (15) is disposed on the front plate (11) and oppositely arranged with the first wind port (14).

11. The shell plate sound isolating structure according to claim 10, wherein the U-shaped shield plate, the U-shaped shield plate is disposed between the front plate and the rear plate, and a partition space is formed between the U-shaped shield plate, the left side plate and the right side plate.

12. The shell plate sound isolating structure according to claim 1, further including a plurality of screws (4), wherein a plurality of screw hole columns (17) are extended from the front plate (11) or the rear plate (12), a plurality of lock holes (18) are formed on the front plate (11) or the rear plate (12) where the screw hole columns (17) are not provided, and each of the screws (4) is screwed in each of the lock holes (18) and each of the screw hole columns (17) respectively.

\* \* \* \* \*